United States Patent
Chuang et al.

(10) Patent No.: US 9,406,784 B1
(45) Date of Patent: Aug. 2, 2016

(54) METHOD OF MANUFACTURING ISOLATION STRUCTURE AND NON-VOLATILE MEMORY WITH THE ISOLATION STRUCTURE

(71) Applicant: Powerchip Technology Corporation, Hsinchu (TW)

(72) Inventors: Chun-Yu Chuang, Taoyuan (TW); Yi-Lin Hsu, Hsinchu County (TW); Liang-Chuan Lai, Hsinchu County (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/691,580

(22) Filed: Apr. 21, 2015

(30) Foreign Application Priority Data

Feb. 2, 2015 (TW) .............................. 104103413 A

(51) Int. Cl.
  *H01L 29/66* (2006.01)
  *H01L 21/28* (2006.01)
  *H01L 21/283* (2006.01)
  *H01L 21/762* (2006.01)
  *H01L 27/115* (2006.01)

(52) U.S. Cl.
  CPC ........ *H01L 29/66825* (2013.01); *H01L 21/283* (2013.01); *H01L 21/28273* (2013.01); *H01L 21/76224* (2013.01); *H01L 27/11524* (2013.01); *H01L 29/66553* (2013.01)

(58) Field of Classification Search
  CPC .................................................. H01L 29/7881
  See application file for complete search history.

(56) References Cited

U.S. PATENT DOCUMENTS

| 5,952,692 A | * | 9/1999 | Nakazato | B82Y 10/00 257/321 |
| 6,146,932 A | * | 11/2000 | Roh | H01L 21/76897 257/E21.433 |
| 6,220,681 B1 | | 4/2001 | Swensson et al. | |
| 6,525,367 B1 | * | 2/2003 | Moriyama | H01L 27/115 257/314 |
| 7,541,240 B2 | | 6/2009 | Pham et al. | |
| 8,097,507 B2 | * | 1/2012 | Jeon | H01L 29/513 257/E21.681 |
| 8,324,679 B2 | | 12/2012 | Ichige et al. | |
| 2002/0115270 A1 | | 8/2002 | Wu | |
| 2006/0278919 A1 | * | 12/2006 | Takahashi | H01L 27/115 257/316 |
| 2007/0018201 A1 | * | 1/2007 | Specht | H01L 21/84 257/204 |
| 2007/0048993 A1 | * | 3/2007 | Willer | H01L 21/76895 438/597 |
| 2008/0081411 A1 | | 4/2008 | Cho et al. | |

(Continued)

OTHER PUBLICATIONS

Office Action of Taiwan Counterpart Application, issued on Apr. 28, 2016, pp. 1-6, in which the listed references were cited.

*Primary Examiner* — Mohammad Islam
*Assistant Examiner* — Ankush Singal
(74) *Attorney, Agent, or Firm* — Jianq Chyun IP Office

(57) ABSTRACT

A method of manufacturing an isolation structure suitable for a non-volatile memory is provided. A substrate is provided. A dielectric layer, a conductive layer, and a hard mask layer are sequentially formed on the substrate. The hard mask layer and the conductive layer are patterned to form a first trench which exposes the dielectric layer. A first liner is formed on the substrate. The first liner and the dielectric layer that are exposed by the first trench are removed to expose the substrate. A spacer is formed on sidewalls of the conductive layer and the hard mask layer. The substrate is partly removed to form in a second trench with use of the conductive layer and the hard mask layer with the spacer as a mask. An isolation layer is formed in the second trench. The distance between the conductive layers is greater than the width of the second trench.

16 Claims, 4 Drawing Sheets

(56) References Cited

U.S. PATENT DOCUMENTS

| | | | | |
|---|---|---|---|---|
| 2008/0242047 A1* | 10/2008 | Shin | H01L 21/76232 | 438/438 |
| 2009/0026525 A1* | 1/2009 | Wang | H01L 27/115 | 257/316 |
| 2009/0068816 A1* | 3/2009 | Eun | H01L 21/76232 | 438/425 |
| 2009/0212345 A1* | 8/2009 | Lee | H01L 27/115 | 257/321 |
| 2011/0104881 A1* | 5/2011 | Lee | H01L 21/28247 | 438/591 |
| 2012/0132982 A1* | 5/2012 | Lee | H01L 21/28273 | 257/321 |
| 2012/0153374 A1* | 6/2012 | Inaba | H01L 27/11531 | 257/316 |
| 2013/0307028 A1* | 11/2013 | Lee | H01L 27/11524 | 257/204 |
| 2013/0309856 A1* | 11/2013 | Jagannathan | H01L 21/845 | 438/587 |
| 2014/0042516 A1* | 2/2014 | Kim | H01L 29/0649 | 257/315 |
| 2014/0061759 A1* | 3/2014 | Lee | H01L 29/66825 | 257/321 |
| 2014/0209990 A1* | 7/2014 | Lu | H01L 23/48 | 257/315 |
| 2015/0206968 A1* | 7/2015 | Cascino | H01L 29/7823 | 257/339 |

\* cited by examiner

METHOD OF MANUFACTURING ISOLATION STRUCTURE AND NON-VOLATILE MEMORY WITH THE ISOLATION STRUCTURE

CROSS-REFERENCE TO RELATED APPLICATION

This application claims the priority benefit of Taiwan application serial no. 104103413, filed on Feb. 2, 2015. The entirety of the above-mentioned patent application is hereby incorporated by reference herein and made a part of this specification.

FIELD OF THE INVENTION

The invention relates to a method of manufacturing a semiconductor device; more specifically, the invention relates to a method of manufacturing an isolation structure and a method of manufacturing a non-volatile memory with the isolation structure

DESCRIPTION OF RELATED ART

A non-volatile memory has been widely used in personal computers and electronic equipment because data can be stored into, read from, and erased from the non-volatile memory a number of times and because the stored data can be retained even after power supply is cut off.

In a typical non-volatile memory, floating gates and control gates are made of doped polysilicon. Generally, the greater the gate-coupling ratio (GCR) between the floating gates and the control gates, the lower the floating gate coupling between the floating gates. In response thereto, the operation speed and the efficiency of the non-volatile memory are increased. Methods of enhancing the GCR include an increase in the capacitance of an inter-gate dielectric layer or a decrease in the capacitance of a tunneling dielectric layer.

Along with the rapid progress of science and technologies, the level of integration of semiconductor devices increases, and therefore dimensions of various memory devices need be further reduced. In the event of reducing the dimensions of the memory devices, however, the excessive electric field of the tunneling dielectric layer may result in tunnel oxide breakdown, which leads to the reduction of the reliability of the devices. In order to further enhance the reliability as well as the stability of the devices, solutions to said issues are required.

SUMMARY OF THE INVENTION

The invention is directed to a method of manufacturing an isolation structure to reduce an electric field of a tunneling dielectric layer, enhance a gate-coupling ratio (GCR), improve performance of devices, and increase reliability of the devices.

The invention is further directed to a method of manufacturing a non-volatile memory having said isolation structure, so as to enhance the GCR as well as a trench-filling ability of a conductive layer of a control gate; meanwhile, interference between or among floating gates can be reduced.

In an embodiment of the invention, a method of manufacturing an isolation structure includes following steps. A substrate is provided, and a dielectric layer, a conductive layer, and a hard mask layer are sequentially formed on the substrate. The hard mask layer and the conductive layer are patterned to form a first trench which exposes the dielectric layer. A first liner is formed on the substrate. The first liner and the dielectric layer that are exposed by the first trench are removed to expose the substrate and form a spacer on a sidewall of the conductive layer and a sidewall of the hard mask layer, respectively. A portion of the substrate is removed to form in a second trench with use of the conductive layer (having the spacer) and the hard mask layer (having the spacer) as a mask. An isolation layer is formed in the second trench, and a distance between the conductive layers is greater than a width of the second trench.

According to an embodiment of the invention, the step of forming the isolation layer in the second trench includes: forming a second liner in the second trench, performing an annealing process, filling the second trench with an insulation material layer, and performing a curing process.

According to an embodiment of the invention, a method of forming the first liner includes an in-situ steam generation (ISSG) method, a thermal oxidation method, or an atomic layer deposition (ALD) method.

According to an embodiment of the invention, a material of the dielectric layer includes silicon oxide.

According to an embodiment of the invention, the conductive layer includes a doped polysilicon layer and a non-doped polysilicon layer.

According to an embodiment of the invention, a material of the hard mask layer includes silicon nitride or silicon oxide.

According to an embodiment of the invention, a material of the first liner includes silicon oxide.

According to an embodiment of the invention, a material of the insulation material layer includes a spin-on dielectric (SOD) material.

According to an embodiment of the invention, a material of the second liner includes silicon oxide.

In an embodiment of the invention, a method of manufacturing a non-volatile memory includes following steps. A substrate is provided, and a dielectric layer, a first conductive layer, and a hard mask layer are sequentially formed on the substrate. The hard mask layer and the first conductive layer are patterned to form a first trench. A spacer is formed on a sidewall of the hard mask layer and on a sidewall of the first conductive layer, respectively. A portion of the substrate is removed to form a second trench with use of the first conductive layer and the hard mask layer with the spacer as a mask. An isolation layer is formed in the second trench, and a distance between the first conductive layers is greater than a width of the second trench. The hard mask layer is removed, and an inter-gate dielectric layer is formed on the substrate. A second conductive layer is formed on the inter-gate dielectric layer. The second conductive layer, the inter-gate dielectric layer, and the first conductive layer are patterned to form a control gate and a floating gate.

According to an embodiment of the invention, the first conductive layer includes a doped polysilicon layer and a non-doped polysilicon layer.

According to an embodiment of the invention, a method of forming the first liner includes an ISSG method, a thermal oxidation method, or an ALD method.

According to an embodiment of the invention, a material of the dielectric layer includes silicon oxide.

According to an embodiment of the invention, a material of the hard mask layer includes silicon nitride or silicon oxide.

According to an embodiment of the invention, a material of the first liner includes silicon oxide.

According to an embodiment of the invention, a material of the inter-gate dielectric layer includes silicon oxide/silicon nitride/silicon oxide.

According to an embodiment of the invention, a material of the second conductive layer includes doped polysilicon.

In view of the above, by applying the method of manufacturing the isolation structure and the method of manufacturing the non-volatile memory having the isolation structure, the distance between two adjacent floating gates is greater than the width of the trench in the isolation structure; that is, the distance between two adjacent floating gates is greater than that provided in the related art. As such, the resultant conductor acting as the control gate is characterized by favorable trench-filling capabilities, interference between the floating gates can be reduced, and performance of devices can be improved. In addition, the fact that the distance between two adjacent floating gates is greater than the width of the trench in the isolation structure results in the reduction of the electric field of the tunneling dielectric layer without incurring the breakdown of the tunneling dielectric layer, and accordingly the reliability and the stability of the devices can be enhanced.

Several exemplary embodiments accompanied with figures are described in detail below to further describe the invention in details.

DETAILED DESCRIPTION OF DISCLOSED EMBODIMENTS

FIG. 1A through FIG. 1E are schematic cross-sectional views illustrating a process flow of manufacturing a non-volatile memory according to an embodiment of the invention. Note that the cross-sectional views in FIG. 1A to FIG. 1E are taken in a direction parallel to directions of word lines of memory units or perpendicular to directions of bit lines of the memory units.

Figure 1A:
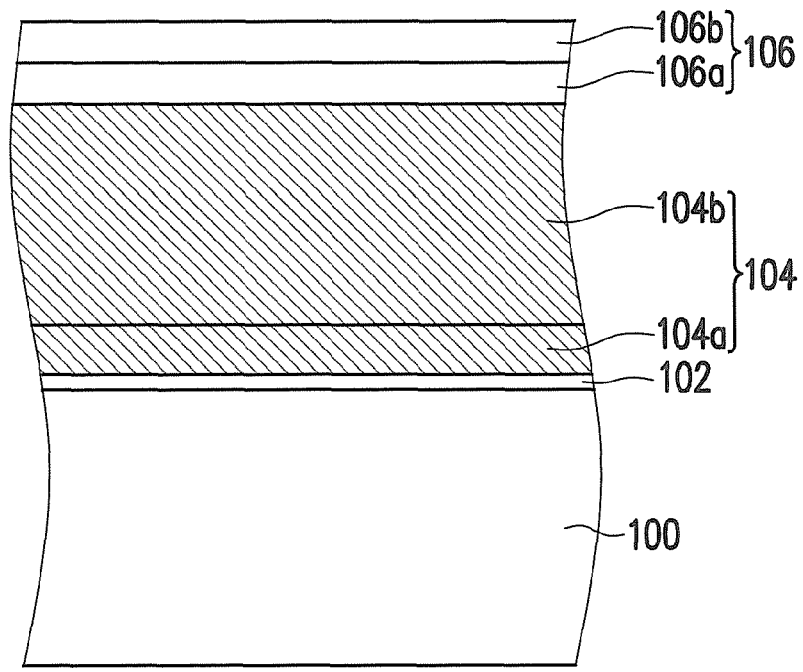
FIG. 1A through FIG. 1E are schematic cross-sectional views illustrating a process flow of manufacturing a non-volatile memory according to an embodiment of the invention.

With reference to FIG. 1A, a substrate 100 is provided. The substrate 100 is, for instance, a silicon substrate. A dielectric layer 102, a conductive layer 104, and a hard mask layer 106 are sequentially formed on the substrate 100.

A material of the dielectric layer 102 is, for instance, silicon oxide, and the dielectric layer 102 is formed, for instance, by thermal oxidation.

The conductive layer 104, for instance, has a double-layer structure constituted by conductive layers 104a and 104b. A material of the conductive layer 104a is, for instance, non-doped polysilicon, and a method of fabricating the same is, for instance, chemical vapor deposition (CVD). A material of the conductive layer 104b is, for instance, doped polysilicon, and a method of fabricating the same includes steps of forming a non-doped polysilicon layer through CVD and performing ion implantation. The conductive layer 104b can also be formed by performing a chemical vapor deposition process with in-situ dopant implantation. The double-layer structure can expand the surface area of the conductive layer 104; that is, the surface area of the conductive layer 104 acting as the floating gate (as shown in FIG. 1E) is increased, and a coupling ratio between the floating gate and a subsequently forming control gate can be raised. According to the present embodiment, the conductive layer 104 has the double-layer structure, for instance, and the conductive layer 104 can also have a single-layer structure or a multi-layer structure.

The hard mask layer 106, for instance, has a double-layer structure constituted by hard mask layers 106a and 106b. A material of the hard mask layer 106a is, for instance, silicon nitride, and a method of forming the hard mask layer 106a is CVD, for instance. A material of the hard mask layer 106b is, for instance, silicon oxide, and a method of forming the hard mask layer 106b is CVD, for instance. According to the present embodiment, the hard mask layer 106 has the double-layer structure, for instance, and the hard mask layer 106 can also have a single-layer structure or a multi-layer structure.

Figure 1B:
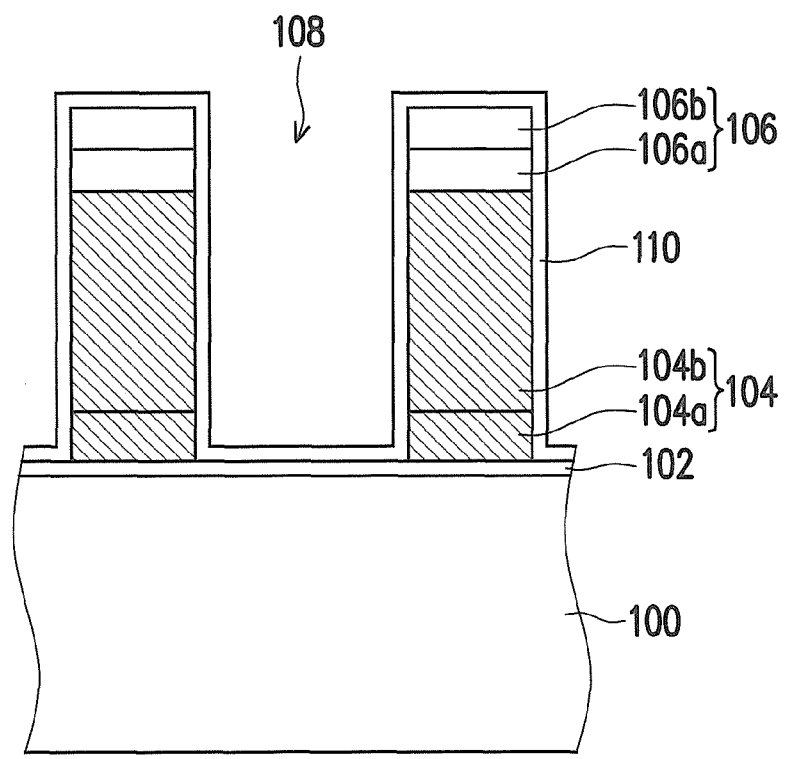

With reference to FIG. 1B, the hard mask layer 106 and the conductive layer 104 are patterned to form a first trench 108 which exposes the dielectric layer 102. A method of patterning the hard mask layer 106 and the conductive layer 104 includes steps of forming a patterned photoresist layer (not shown) on the substrate 100, etching the hard mask layer 106 and the conductive layer 104 with use of the patterned photoresist layer as a mask, and removing the photoresist layer, for instance. A first liner 110 is formed on the substrate 100. A material of the first liner 110 is, for instance, silicon oxide, and a method of forming the same is thermal oxide, for instance; however, the method of forming the first liner 110 may also be in-situ steam generation (ISSG) or atomic layer deposition (ALD).

Figure 1C:
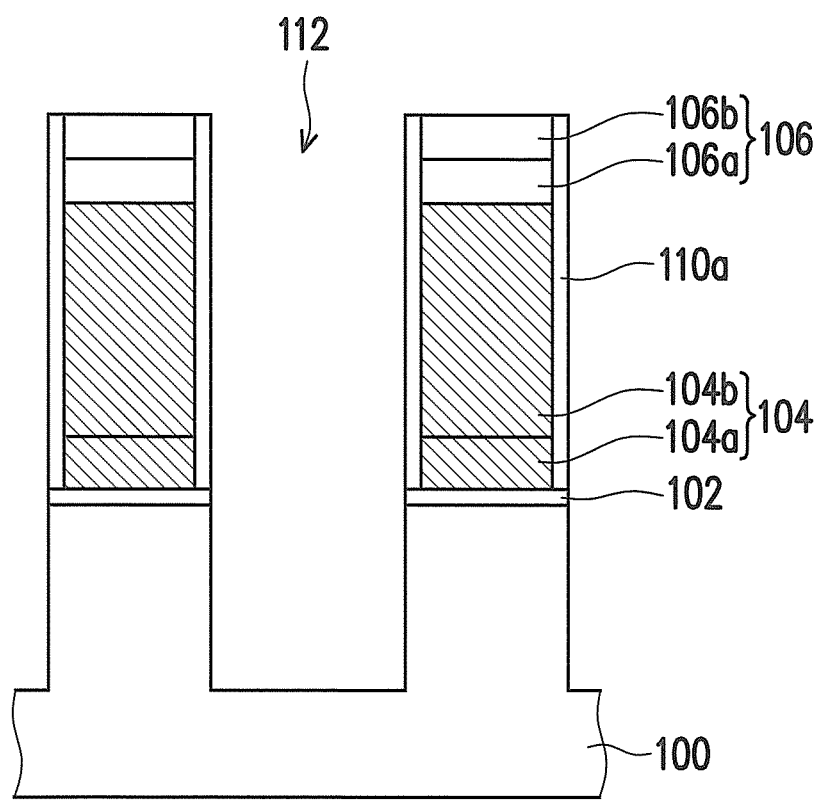

With reference to FIG. 1C, the first liner 110 and the dielectric layer 102 that are exposed by the first trench 108 are removed to expose the substrate 100 and form a spacer 110a on a sidewall of the conductive layer 104 and a sidewall of the hard mask layer 106, respectively. A method of removing the first liner 110 and the dielectric layer 102 exposed by the first trench 108 is, for instance, anisotropic etching. Through anisotropic etching, the first liner 110 on the hard mask layer 106 is removed as well. A portion of the substrate 100 is removed to form a second trench 112 with use of the conductive layer 104 (having the spacer 110a) and the hard mask layer 106 (having the spacer 110a) collectively acting as a mask. A method of removing a portion of the substrate 100 is, for instance, etching.

Figure 1D:
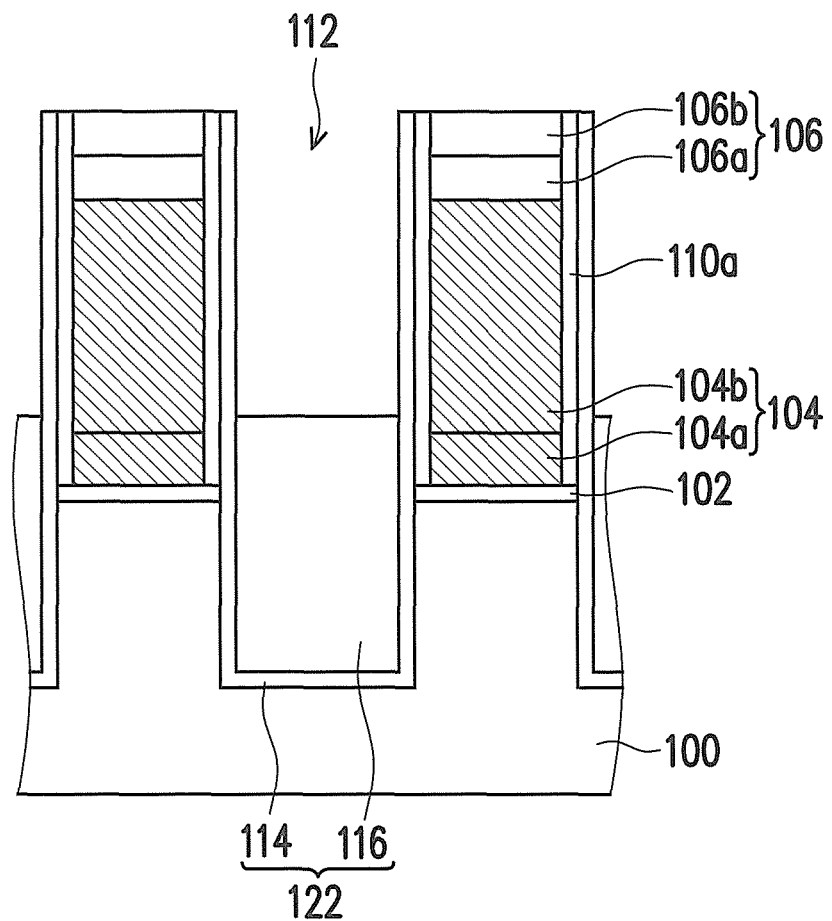
Figure 1E:
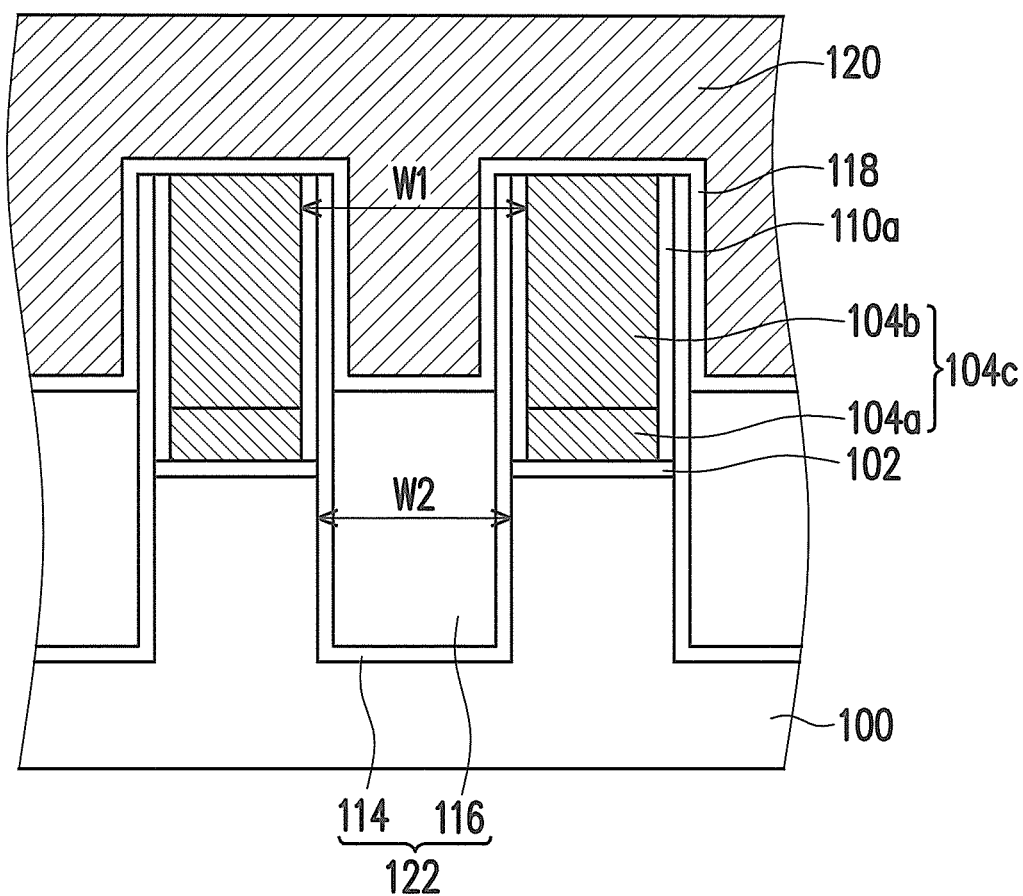

With reference to FIG. 1D, an isolation layer 122 is formed in the second trench 112. The isolation layer 122 is constituted by a second liner 114 and an insulation material layer 116, for instance.

A method of forming the isolation layer 122 in the second trench 112 includes following steps. The second liner 114 is formed in the second trench 112. A material of the second liner 114 is, for instance, silicon oxide, and a method for fabricating the same is, for instance, thermal oxidation; alternatively, the second liner 114 may also be formed by applying an ISSG method. An annealing process is then performed in a nitrogen-containing environment. The second trench 112 is filled with an insulation material layer 116. A material of the insulation material layer 116 is, for instance, a spin-on dielectric (SOD) material or any other appropriate insulation material, for instance. A curing process is performed, and an active area is defined. A method of filling the second trench 112 with the insulation material layer 116 may be a spin-coating method, for instance; alternatively, the second trench 112 may be filled with the insulation material layer 116 by forming an insulation material layer 116 through CVD, performing a planarization process through chemical-mechanical polishing, and performing an etch back process to remove at least a portion of the insulation material layer 116.

With reference to FIG. 1E, the hard mask layer 106 is removed. A method of removing the hard mask layer 106 includes a step of sequentially removing the mask layer 106b and the mask layer 106a through etching.

An inter-gate dielectric layer 118 is formed on the substrate 100. A material of the inter-gate dielectric layer 118 is, for instance, silicon oxide/silicon nitride/silicon oxide (ONO), and a method of forming the same may include a step of sequentially forming a silicon oxide layer, a silicon nitride layer, and a silicon oxide layer through CVD or thermal oxidation, for instance. The material of the inter-gate dielectric layer 118 can also be silicon oxide, silicon nitride, silicon oxide/silicon nitride, and so on. Besides, the method of forming the inter-gate dielectric layer 118 may include CVD with use of different reaction gases in response to different materials of the inter-gate dielectric layer 118.

A conductive layer 120 is formed on the inter-gate dielectric layer 118. A material of the conductive layer 120 is, for instance, doped polysilicon, and a method of fabricating the same includes steps of forming a non-doped polysilicon layer through CVD and performing ion implantation. The conductive layer 120 can also be formed by performing a chemical vapor deposition process with in-situ dopant implantation. The conductive layer 120, the inter-gate dielectric layer 118, and the conductive layer 104 are patterned. The patterned conductive layer 120 constitutes the control gate, and the patterned conductive layer 104 constitutes the floating gate 104c. Since the subsequent steps of forming a non-volatile memory are well known to people having ordinary skill in the pertinent art, detailed descriptions are omitted hereinafter.

As provided herein, by applying the method of manufacturing the isolation structure and the method of manufacturing the non-volatile memory having the isolation structure, the distance W1 between two adjacent floating gates 104c is greater than the width W2 of the second trench 112; by contrast, the distance between two adjacent floating gates is equal to the width of the second trench according to the related art. As such, the resultant conductive layer 120 is characterized by favorable trench-filling capabilities, interference between the floating gates 104c can be reduced, and performance of devices can be improved. In addition, the fact that the distance W1 between two adjacent floating gates 104c is greater than the width W2 of the second trench 112 in the isolation structure results in the reduction of the electric field of the tunneling dielectric layer without incurring the breakdown of the tunneling dielectric layer, and accordingly the reliability and the stability of the devices can be enhanced.

Although the invention has been disclosed by the above embodiments, they are not intended to limit the invention. Persons skilled in the art may make some modifications and alterations without departing from the spirit and scope of the invention. Therefore, the protection range of the invention falls in the appended claims.

What is claimed is:

1. A method of manufacturing an isolation structure, comprising:
   providing a substrate;
   sequentially forming a dielectric layer, a conductive layer, and a hard mask layer on the substrate;
   patterning the hard mask layer and the conductive layer to form a first trench exposing the dielectric layer;
   forming a first liner on the substrate;
   removing the first liner and the dielectric layer exposed by the first trench, so as to expose the substrate and form a spacer on a sidewall of the conductive layer and a sidewall of the hard mask layer, respectively, wherein the spacer is formed from the first liner;
   removing a portion of the substrate to form a second trench by using the conductive layer and the hard mask layer having the spacer as a mask; and
   forming an isolation layer in the second trench, wherein a distance between the conductive layers is greater than a width of the second trench,
     wherein the step of forming the isolation layer in the second trench comprises:
     forming a second liner in the second trench;
     performing an annealing process;
     filling the second trench with an insulation material layer; and
     performing a curing process.

2. The method of claim 1, wherein a method of forming the first liner comprises an in-situ steam generation method, a thermal oxidation method, or an atomic layer deposition method.

3. The method of claim 1, wherein a material of the dielectric layer comprises silicon oxide.

4. The method of claim 1, wherein a material of the conductive layer comprises a doped polysilicon layer and a non-doped polysilicon layer.

5. The method of claim 1, wherein a material of the hard mask layer comprises silicon nitride or silicon oxide.

6. The method of claim 1, wherein a material of the first liner comprises silicon oxide.

7. The method of claim 1, wherein a material of the insulation material layer comprises a spin-on dielectric material.

8. The method of claim 1, wherein a material of the second liner comprises silicon oxide.

9. A method of manufacturing a non-volatile memory, comprising:
   providing a substrate, a dielectric layer, a first conductive layer, and a hard mask layer being sequentially formed on the substrate;
   patterning the hard mask layer and the first conductive layer to form a first trench exposing the dielectric layer;
   forming a first liner on the substrate;
   removing the first liner and the dielectric layer exposed by the first trench, so as to expose the substrate and form a spacer on a sidewall of the first conductive layer and a sidewall of the hard mask layer, respectively, wherein the spacer is formed from the first liner;
   removing a portion of the substrate to form a second trench by using the first conductive layer and the hard mask layer having the spacer as a mask;
   forming an isolation layer in the second trench, wherein a distance between the first conductive layers is greater than a width of the second trench, wherein the step of forming the isolation layer in the second trench comprises:
     forming a second liner in the second trench;
     performing an annealing process;
     filling the second trench with an insulation material layer; and
     performing a curing process;
   removing the hard mask layer;
   Ruining an inter-gate dielectric layer on the substrate;
   forming a second conductive layer on the inter-gate dielectric layer; and
   patterning the second conductive layer, the inter-gate dielectric layer, and the first conductive layer to form a control gate and a floating gate.

10. The method of claim 9, wherein the first conductive layer comprises a doped polysilicon layer and a non-doped polysilicon layer.

11. The method of claim 9, wherein a method of forming the first liner comprises an in-situ steam generation method, a thermal oxidation method, or an atomic layer deposition method.

12. The method of claim 9, wherein a material of the dielectric layer comprises silicon oxide.

13. The method of claim 9, wherein a material of the hard mask layer comprises silicon nitride or silicon oxide.

14. The method of claim 9, wherein a material of the first liner comprises silicon oxide.

15. The method of claim 9, wherein a material of the inter-gate dielectric layer comprises silicon oxide/silicon nitride/silicon oxide.

16. The method of claim 9, wherein a material of the second conductive layer comprises doped polysilicon.

* * * * *